(12) United States Patent
Ribarich

(10) Patent No.: US 7,976,182 B2
(45) Date of Patent: Jul. 12, 2011

(54) LED LAMP ASSEMBLY WITH TEMPERATURE CONTROL AND METHOD OF MAKING THE SAME

(75) Inventor: Thomas Ribarich, Laguna Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 492 days.

(21) Appl. No.: 12/053,283

(22) Filed: Mar. 21, 2008

(65) Prior Publication Data

US 2008/0232119 A1    Sep. 25, 2008

Related U.S. Application Data

(60) Provisional application No. 60/896,112, filed on Mar. 21, 2007.

(51) Int. Cl.
*F21S 4/00*    (2006.01)

(52) U.S. Cl. .. 362/221; 362/97.3; 362/294; 362/311.02; 362/373; 362/646

(58) Field of Classification Search ............... 362/97.3, 362/221, 249.05, 249.12, 255, 256, 294, 362/311.02, 311.05, 311.14, 373, 646
See application file for complete search history.

(56) References Cited

U.S. PATENT DOCUMENTS

2006/0173245 A1 * 8/2006 Todd et al. .............. 600/178
2006/0278885 A1 * 12/2006 Tain et al. .............. 257/99

* cited by examiner

*Primary Examiner* — Stephen F Husar
*Assistant Examiner* — Meghan K Dunwiddie
(74) *Attorney, Agent, or Firm* — Farjami & Farjami LLP

(57) ABSTRACT

An light emitting diode lamp assembly in accordance with an embodiment of the present application includes a base, a ballast circuit mounted on a circuit board and operable to provide a desired output current and a light emitting diode electrically connected to the ballast and driven by the output current of the ballast circuit to provide light. The base is filled with a thermally conductive substance and the circuit board is mounted in the base and in thermal contact with the thermally conductive substance such that heat is drawn away from the light emitting diode through the circuit board and into the thermally conductive substance to the base.

18 Claims, 5 Drawing Sheets

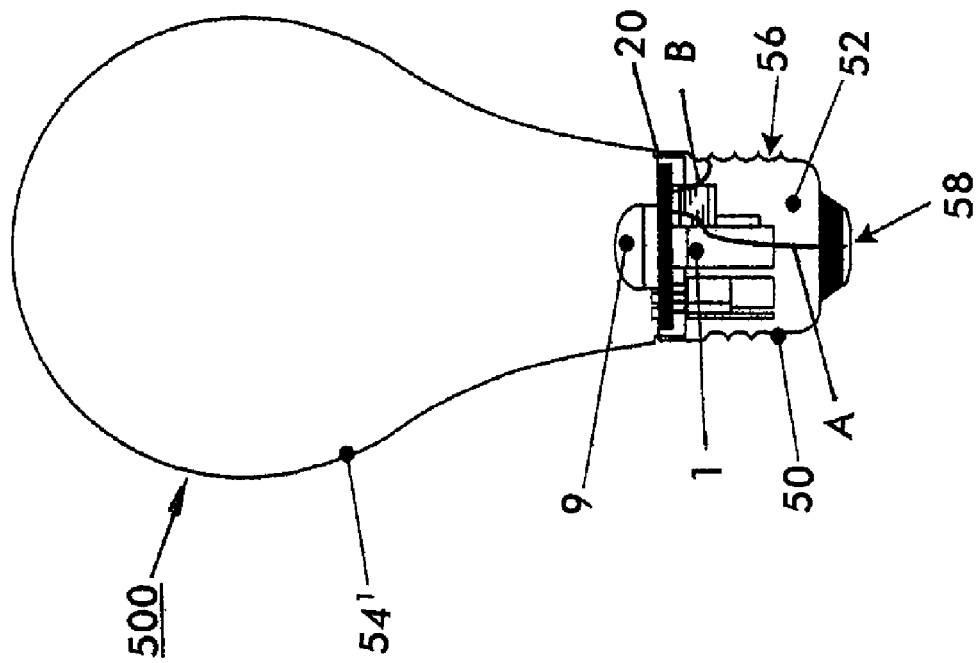
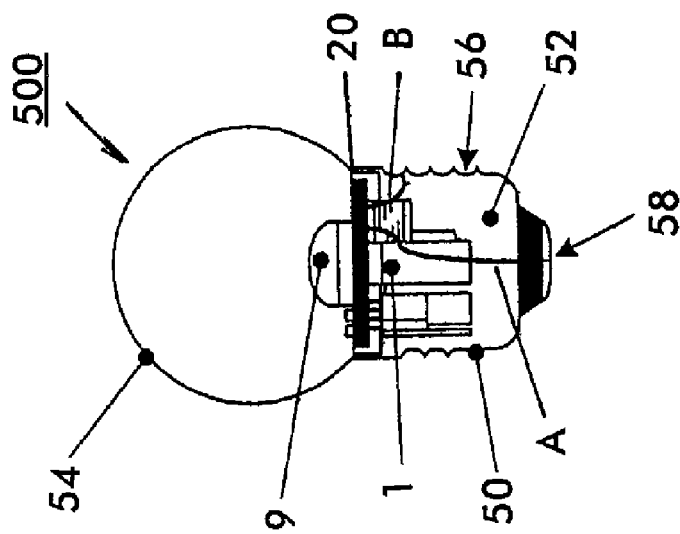

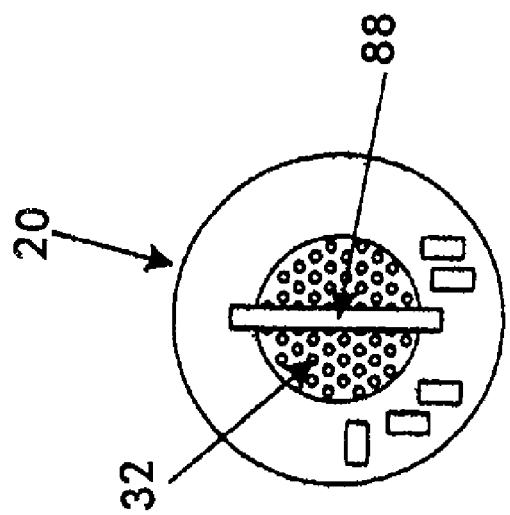
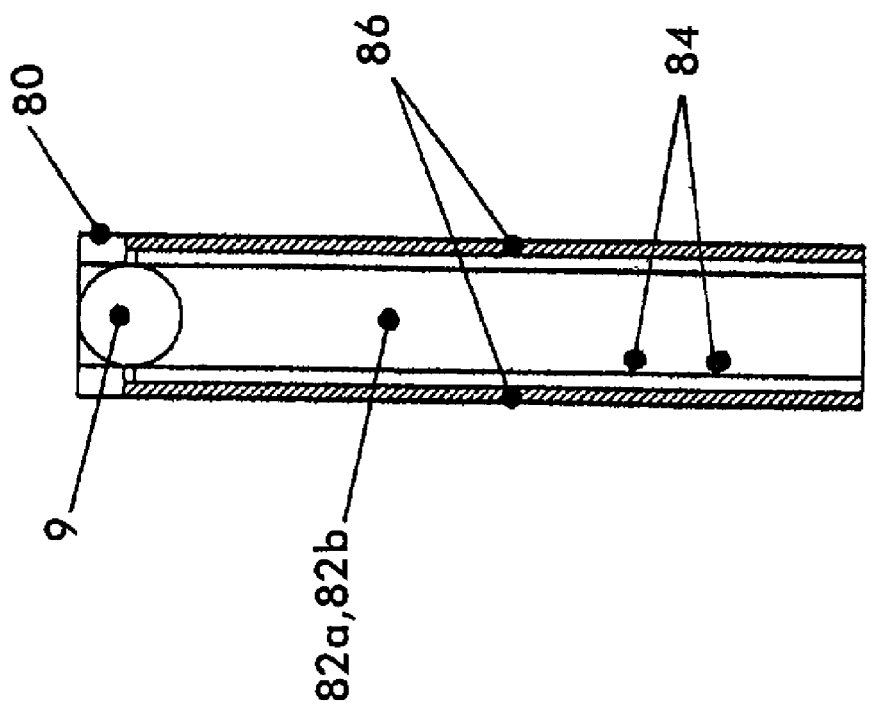
FIG. 9b
FIG. 9a

LED LAMP ASSEMBLY WITH TEMPERATURE CONTROL AND METHOD OF MAKING THE SAME

CROSS-REFERENCE TO RELATED APPLICATIONS

The present application claims benefit of and priority to U.S. Provisional Patent Application Ser. No. 60/896,112 entitled INTEGRATED LED LIGHT BULB filed Mar. 21, 2007, the entire contents of which are hereby incorporated by reference herein.

BACKGROUND

1. Field of the Disclosure

The present invention relates to a light emitting diode (LED) lamp assembly including an integrated electronic ballast and a thermal management system.

2. Related Art

Incandescent light bulbs, or lamps, have been in existence for over 100 years and are the primary type of light source used in a wide variety of lighting applications. For example, incandescent light bulbs are commonly used in a residential setting whether in recessed downlight ceiling fixtures or standard table lamps. Incandescent lamps give off light from a filament that is heated in a process known as incandescence. However, incandescent lamps have very low efficiency. Only about 5% of the electricity provided to the lamps is used to produce light, the remaining 95% is wasted as heat. Recently, the development of the compact fluorescent lamp (CFL) has offered improved efficiency. CFLs typically convert about 25% of the energy applied to them to light with only 75% being lost as heat. Thus, about five time less energy is required to provide an equivalent amount of light in a CFL when compared with an incandescent lamp. That is, a 12 watt CFL will provide roughly the same amount of light as a 60 watt incandescent lamp. CFL's also generally last about 5 times longer than incandescent lamps, as well. Typically, an incandescent lamp will have a 2000 hour lifetime while a CFL generally has a 10,000 hour lifetime.

CFLs are already popular in commercial applications such as hotels and other commercial spaces, due to the savings they can offer in energy use and in increased lifetime. One disadvantage of CFLs, however, is the quality of the light produced. CFLs produce light that has a different spectrum compared to incandescent lamps. As a result, CFLs do not provide the same warm white color that incandescent lamps provide and thus are typically not favored in residential environments. In addition, CFLs require a longer turn-on and warm up time as well. Further, CFLs are typically not dimmable using standard phase-cutting wall dimmers, and thus, may not be easily incorporated into existing lighting systems. CFLs also require electronic ballasts between the AC mains voltage and the lamp to control lamp power. The electronic ballasts tend to be unreliable since they must operate at relatively high ambient temperatures. Temperature management is particularly important when they are used in a downlight fixture, for example, where heat rises up into the fixture and cannot escape. These disadvantages have slowed the adoption of CFLs for other applications despite the efficiency advantages that are available using these lamps.

The light emitting diode (LED) has recently been gaining popularity in various lighting applications as improved technology has resulted in an increase in lumens/wattage available in LEDs. LED's create light at the p-n junction of a solid state semi-conductor diode. Advancements in technology have resulted in semi-conductor materials and packaging techniques that have increased the amount of light output from the diode junction, while minimizing losses across the junction. Theoretically, LEDs may be able to provide up to 90% efficiency and a lifetime of 100,000 hours. Thus, LEDs have the potential to offer vastly improved efficiency in comparison to both incandescent lamps and CFLs. High brightness LEDs have already been developed that match fluorescent lighting in lumens/watts and are being used more and more in various applications, such as in traffic lights, signage, emergency lighting, backlighting and street lighting. One disadvantage of LEDs is that they include no true white color and no thermal management. In addition, it typically requires a relatively high number of LEDs to provide sufficient light coverage for any particular desired area. LEDs also require a regulated power supply as well.

As LED technology advances, it will likely be possible to provide white colored light with an LED. In addition, efficiency increases will likely lead to a reduction in the number of LEDs necessary to provide sufficient light coverage for any particular area. However, thermal management concerns will still need to be addressed. Until thermal management issues are resolved, less efficient, but reliable and safe incandescent lamps will likely remain dominant in residential lighting applications.

Accordingly, it would be desirable to provide an LED lamp assembly including an integral electronic ballast and thermal management system.

SUMMARY OF THE INVENTION

It is an object of the present invention to provide an LED lamp assembly preferably for use with an Edison base that includes an integral electronic ballast and thermal management system.

A light emitting diode lamp assembly in accordance with an embodiment of the present application includes a base, a ballast circuit mounted on a circuit board and operable to provide a desired output current and a light emitting diode electrically connected to the ballast and driven by the output current of the ballast circuit to provide light. The base is filled with a thermally conductive substance and the circuit board is mounted in the base and in thermal contact with the thermally conductive substance such that heat is drawn away from the light emitting diode through the circuit board and into the thermally conductive substance to the base.

A method of making a light emitting diode lamp assembly including a base, a ballast circuit mounted on a bottom surface of a printed circuit board and a light emitting diode mounted on a top surface of the printed circuit board in accordance with an embodiment of the present application includes attaching the light emitting diode to the top surface of the printed surface board using surface mount techniques, inverting the printed circuit board, connecting components of the ballast circuit on a bottom surface of the printed circuit board using through-hole techniques, passing the top surface of the printed circuit board through a solder bath such that the all components mounted on the printed circuit board are soldered thereto in a single step while the printed circuit board is inverted, returning the printed circuit board to an upright position, connecting the ballast circuit to a positive and neutral terminal on the base, filling the base with a thermally conductive substance, mounting the printed circuit board in the base with the thermally conductive substance and attaching a glass envelope to the base to enclose the light emitting diode.

A method of making a light emitting diode lamp assembly including a base, a ballast circuit mounted on a bottom surface of a first printed circuit board and a light emitting diode mounted on a rectangular second printed circuit board thermally connected to the top surface of the first printed circuit board in accordance with an embodiment of the present application includes attaching control components to the top surface of the first printed surface board using surface mounting techniques, inverting the printed circuit board, connecting components of the ballast circuit on a bottom surface of the printed circuit board using through hole terminals, mounting the second printed circuit board in a slot formed on the first printed circuit board, mounting the light emitting diode on the second printed circuit board, passing the top surface of the printed circuit board through a solder bath such that the all components mounted on the printed circuit board are soldered thereto in a single step while the printed circuit board is inverted, connecting the ballast circuit to a positive and neutral terminal on the base, filling the base with a thermally conductive substance, mounting the printed circuit board in the base with the thermally conductive substance in the inverted position such that the second printed circuit board extends upward away from the base and attaching a glass envelope to the base to enclose the light emitting diode.

Other features and advantages of the present invention will become apparent from the following description of the invention which refers to the accompanying drawings.

BRIEF DESCRIPTION OF THE DRAWING(S)

FIG. 5 is an illustration of a light emitting diode lamp assembly in accordance with an embodiment of the present application.

FIG. 6 is an illustration of a light emitting diode lamp assembly in accordance with another embodiment of the present application.

FIG. 9a is a more detailed illustration of a second printed circuit board in the light emitting diode lamp assembly of FIG. 8.

FIG. 9b illustrates a slot formed in a primary printed circuit board of the light emitting diode lamp assembly of FIG. 8 in which the second printed circuit board of FIG. 9a is mounted.

DETAILED DESCRIPTION OF PREFERRED EMBODIMENTS OF THE INVENTION

Figure 1:
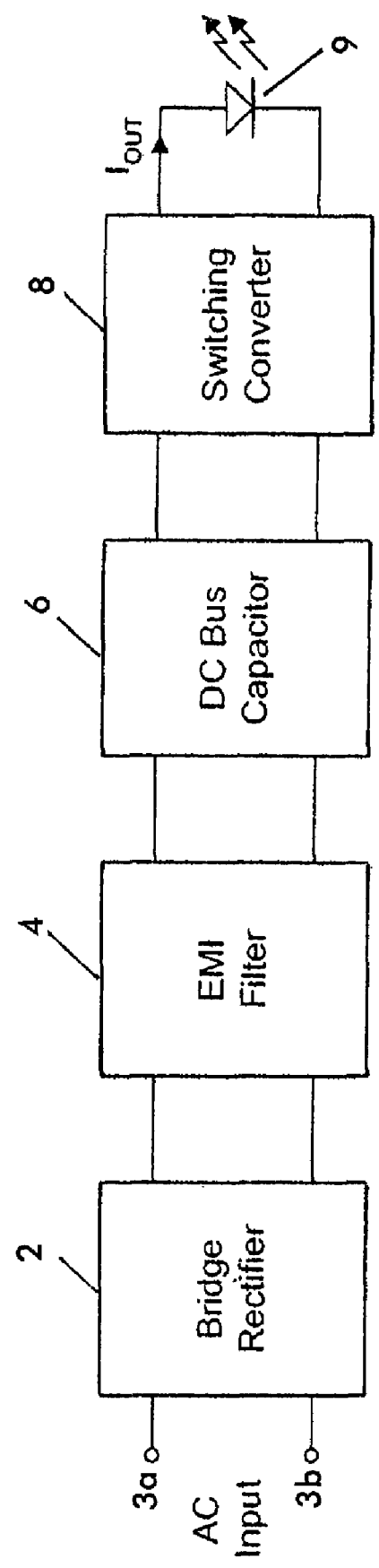
FIG. 1 is a block diagram illustrating an exemplary embodiment of a ballast circuit for use in a light emitting diode lamp assembly in accordance with an embodiment of the present application.

A light emitting diode (LED) lamp assembly 500 (See FIG. 5) in accordance with an embodiment of the present application preferably includes a ballast circuit 1 similar to that illustrated by the block diagram of FIG. 1. In a preferred embodiment, the LED lamp assembly 500 includes an LED 9 mounted on a printed circuit board 20 (See FIG. 4, for example) on which the ballast circuit 1, for example, is mounted in order to provide power to the LED. (See FIG. 5, for example). As can be seen with reference to FIG. 1, the ballast circuit 1 preferably includes a full bridge rectifier 2 that converts an AC input voltage into a DC bus voltage. This AC input voltage is preferably provided via AC terminals 3a,3b connected to AC mains, for example via a light socket (not shown). An electromagnetic interference (EMI) filter 4 is preferably provided to reduce electromagnetic interference from feeding back to the AC mains. A DC bus capacitor 6 is provided to smooth the DC voltage from the rectifier 2. A switching converter 8 is provided to receive the DC bus voltage and to provide a constant current to drive the LED 9 at a desired brightness. Various topologies may be used for the switching converter 8 including, for example, a step-down buck type. However, any suitable topology may be used. The converter 8 typically includes a primary power switch 8a (See FIGS. 2-4) that provides a pulsed current, an inductor 8b to smooth the pulsed current, a power diode (or second power switch) 8c to provide a current circulation path through the inductor when the primary power switch is OFF and a control circuit 8d that senses the LED current and drives the power switch(es) 8a, 8c at a desired frequency and duty cycle to keep LED current substantially constant. As can be seen with reference to FIG. 1, the LED current is based on the output current $I_{OUT}$ of the converter 8. In a preferred embodiment, the control circuit is implemented in an integral circuit. While specifically illustrated between the rectifier 2 and the DC bus capacitor 6, the EMI filter 4, may be positioned in front of the rectifier as well, if desired. The DC bus capacitor 6 may be removed, if desired, however, this will result in a ripple in the LED current at a frequency twice that of the line frequency. This may result in flicker in the LED 9, but this flicker is generally inconsequential for general lighting applications.

Figure 3:
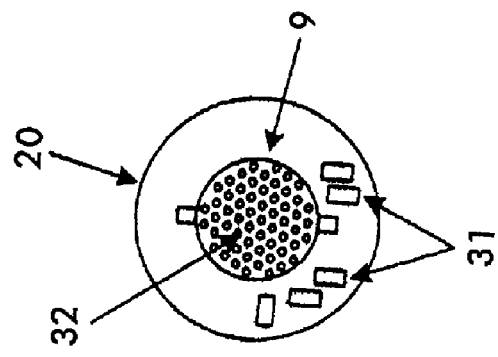
FIG. 3, is a top view of the printed circuit board of FIG. 2.
Figure 4:
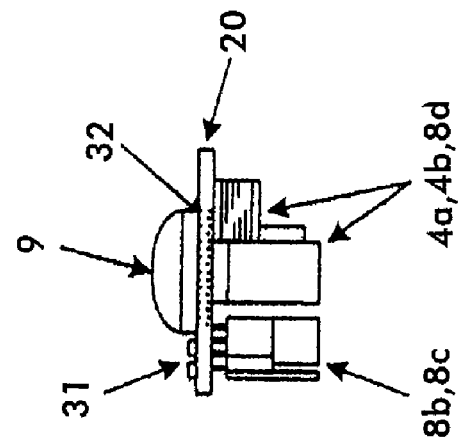
FIG. 4 is a side view of the printed circuit board of FIGS. 2 and 3.
Figure 2:
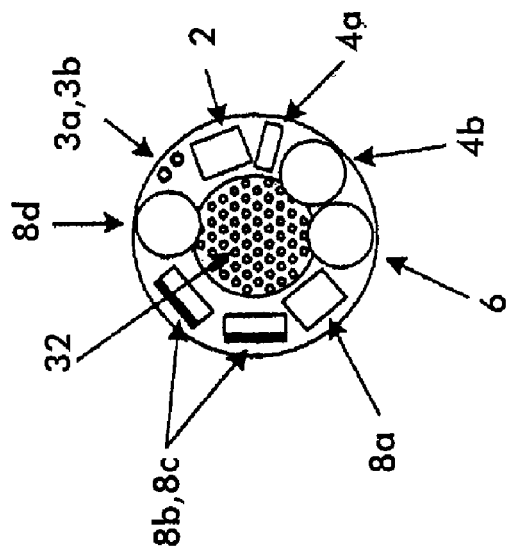
FIG. 2 is a bottom view of a printed circuit board on which the ballast circuit of FIG. 1 may be mounted in accordance with an embodiment of the present application.

In a preferred embodiment, the ballast circuit 1 is mounted on a printed circuit board (PCB) 20 as is illustrated in FIGS. 2-4. FIG. 2 illustrates a bottom view of the PCB 20. The PCB 20 is preferably shaped like a disk and is preferably small enough to fit into an Edison base such as that commonly used in incandescent lamps. The LED 9 is preferably mounted on the top side of the PCB 20 so that the light emitted therefrom is emitted outward from the PCB as illustrated in FIG. 4, for example. In a preferred embodiment, additional surface mount devices (SMD) 31, which preferably include control components, are also mounted on the top surface of the PCB 20 as well. The components 31 may be used to provide a supply voltage for the control circuit 8d of the converter 8, for example. The devices 31 are preferably positioned on the outside perimeter of the PCB 20 such than an open zone is provided in the center of the PCB for thermally conducting heat away from the LED 9. Through hole vias 32 are preferably formed in this open zone to conduct heat away from the bottom of the LED 9 on the top side of the PCB 20 to the bottom side. The components on the top side of the PCB 20 are preferably mounted thereon using surface-mount techniques. The bottom surface of the PCB 20, as illustrated in FIG. 2, for example, preferably includes the components of the ballast circuit 1 discussed above with reference to FIG. 1. More specifically, the bottom surface of the PCB 20 includes the rectifier 2, the capacitor 4a and inductor 4b that provide EMI filtering and the DC bus capacitor 6. In addition, the control circuit 8d, power switches (or diodes) 8a, 8c and output power inductor 8b of the switching converter 8 are also provided on the bottom surface of the PCB 20. In a preferred embodiment, these components are connected to the bottom of PCB 20 via through-hole techniques. The terminals 3a, 3b are also preferably positioned on the bottom side of PCB 20, as well.

The height of the components on the bottom side of the PCB 20 is limited such that they are low enough to allow the entire PCB 20 and bottom side components to fit completely inside screwbase 50 of the LED lamp 500. The screwbase 50 is preferably filled with a thermally conductive epoxy 52 that mechanically secures the PCB 20, on which the ballast circuit 1 is mounted, and thermally conducts heat away from the LED 9 and the ballast circuit 1 mounted on the PCB 20 to the metal screwbase 50. The vias 32 conduct the heat away from the LED 9 directly out through the epoxy 52 and to the base 50. The screwbase 50 is used as a heatsink with the screw grooves (threads) thereof used as fins to increase the flow of heat away from the LED 9 and ballast circuit 1 to reduce LED and ballast temperature. From the screwbase 50, the heat is conducted to the lamp socket and the lamp fixture (not shown). The use of the vias 32, the epoxy 52 and screwbase 50 to draw heat away from the LED 9 and the ballast circuit 1 provides an efficient and practical heat management system. Without these features, the LED 9 and ballast circuit 1 temperatures would be unmanageable and would result in poor LED and ballast reliability and would dramatically decreased the lifetime of both components. The heat management system, including the vias 32, the epoxy 52 and the base 50 of the present application, keeps temperatures on the LED and ballast 1 under 50° C. in a typical light fixture. By limiting temperature to this range, very long LED and ballast lifetime can be expected.

The base 50 preferably includes a live contact 58 and a neutral contact 56 on the outer surface thereof that are connected to the AC mains via a conventional light socket, for example. Wires A and B are provided to electrically connect these contacts to the terminals 3a, 3b of the ballast circuit 1 to provide the AC voltage thereto.

In a preferred embodiment, a glass envelope 54 is provided over the LED 9. The envelope 54 is mounted on either the PCB 20, or on the screwbase 50. The envelope 54 may have a rounded shape as illustrated in FIG. 5, for example. Alternatively, the envelope 54[1] may have a shape similar to that of a conventional incandescent bulb, as is illustrated in FIG. 6, for example. In this case, the LED lamp assembly is suitable for use as a replacement for an A-type incandescent lightbulb in virtually any fixture or socket. Otherwise the assembly 500[1] of FIG. 6 is substantially similar to the assembly 500 of FIG. 5.

Figure 7:
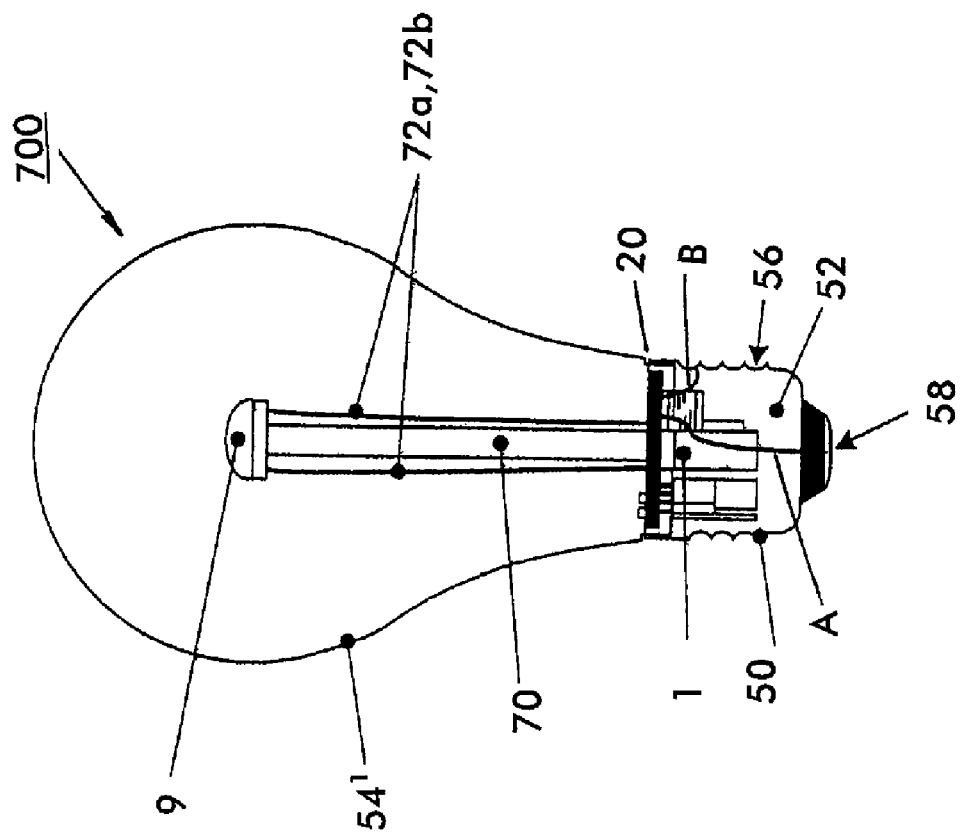
FIG. 7 is an illustration of a light emitting diode lamp assembly in accordance with an alternative embodiment of the present application.

In another embodiment of the present application, in order to increase the light emitting capacity of the LED lamp assembly 700, illustrated in FIG. 7, the LED 9 maybe positioned more in the center of the glass envelope 54[1]. In FIG. 7, the envelope 54[1] is shaped like that of a conventional incandescent lamp. A mounting post 70 is provided to raise the LED 9 off the top surface of the PCB 20. The mounting post 70 is preferably made of a material that conducts heat well, copper, for example, so that the post can conduct heat away from the bottom of the LED 9. The post 70 is thermally connected to the vias 32 on the PCB 20, either directly or through a copper plate (not shown). In this manner, heat from the LED 9 will continue to be conducted to the epoxy 52 and out through the screwbase 50 to keep the LED temperature at an acceptable level. In this embodiment two wires 72a, 72b may be connected to the terminals of the LED 9 on one end and to the PCB 20 on the other end to provide an electrical connection between the LED 9 and the ballast circuit 1 mounted on PCB 20.

An alternative embodiment of an LED lamp assembly 800 in accordance with the present application is described with reference to FIG. 8. In this embodiment, a long rectangular PCB 80 is provided in place of post 70 in FIG. 7. In this embodiment, multiple LEDS 9a, 9b may be used, if desired. The LED(s) are preferably mounted at the upper end of the rectangular PCB 80 and the lower end is mounted vertically in a slot 88 (See FIG. 9) in the center of the first PCB 20. The rectangular PCB 80 preferably includes large copper planes 82a, 82b, positioned on both sides of the board 80 with through hole vias 84 connecting the planes, which run the entire length of the PCB 80. The planes 82a, 82b and vias 84 conduct heat away from the LED(s) 9a, 9b and down the rectangular PCB 80 to the PCB 20 and through the vias 32 to the epoxy 52 and the screwbase 50. Additional traces 86 on the rectangular PCB 80 are preferably provided to electrically connect the LED(s) to the ballast 1 on PCB 20. Thus, no external wires are necessary in this embodiment. In addition, it is noted that in this embodiment, the PCB 20 is preferably flipped over such that the bottom side thereof, illustrated in FIG. 2, for example, faces up. In this way, more epoxy 52 contacts the mounting board and the soldering of components and the mounting board onto the PCB 20 is done in a single step, as is described further below.

Figure 8:
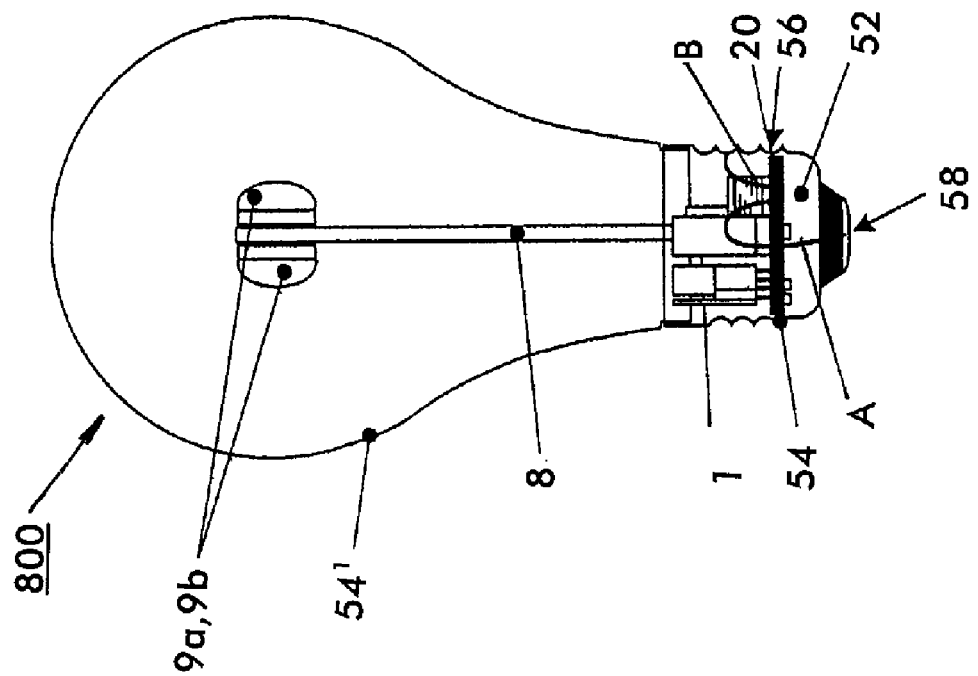
FIG. 8 is an illustration of a light emitting diode lamp assembly in accordance with an embodiment of the present application.

FIG. 9a is a more detailed view of the rectangular PCB 80 of FIG. 8 illustrating trace 86 for electrically connecting the LED 9 to the PCB 20 and the vias 84. FIG. 9b provides a more detailed view of the slot 88 formed on the PCB 20 in which the rectangular PCB 80 is mounted.

It is noted that by providing the LED lamp assembly 500, for example, with surface-mount devices such as the control components 31 and the LED 9 on the top side of the PCB 20 and through-hole connected components in the bottom side of the PCB 20, only a single pass through a solder bath is necessary. For example, in a preferred embodiment, solder paste is put down on the top side of the surface-mount device pads. Thereafter, the top components (LED 9 and control components 31) are preferably glued down on the top side of the PCB 20. The LED 9 is preferably glued down to the vias 32 with thermal epoxy or thermal paste to allow for heat conduction from the LED 9 through the vias and into the epoxy 52. The LED 9 may be glued to the PCB 20 at the edges if desired. Alternatively, the LED may simply be soldered onto a copper plate attached to the vias 32. After this step, the PCB 20 may be turned over and the through-hole components of the ballast circuit 1 and AC terminals and wires A, B may be positioned in their respective through hole pads. While the PCB 20 is upside down, the top side of the board 20 is preferably passed thought a solder bath (wave solder) to solder the LED 9 and the control components 31 and the through hole components in a single step. The AC wires are then connected to the live contact 58 and neutral contact 56 of the screwbase 50 before the screwbase is filled with epoxy 52. The bottom of the PCB 20 with the ballast circuit 1 is placed in the screwbase 50 and the top side thereof including the LED 9 is left exposed above the epoxy. The glass envelope 54 may then be added to finish the lamp assembly 500.

Similarly, the LED lamp assembly 800 of FIG. 8, for example, may be made by placing solder paste down on the top side of the surface-mount device pads of the PCB 20. Thereafter, the top surface-mount components (LED 9 and control components 31) are preferably glued down on the top side of the PCB 20. After this step, the PCB 20 may be turned over and the through hole components and AC terminals and wires are positioned in their respective through hole pads on the bottom side of the PCB 20. In addition, the rectangular PCB 80 is mounted in the slot 88 on the PCB 20. While the PCB 20 is upside down, the top side of the board 20 is preferably passed thought a solder bath (wave solder) to solder the control components 31, through hole components, AC connection terminals and wires and rectangular PCB 80 in a single step. The AC wires are then connected to the live contact 58 and neutral contact 56 of the screwbase 50 before the screwbase is filled with epoxy 52. The PCB 20 is placed in the screwbase 50 with the bottom side facing up, as is noted above, and the rectangular PCB 80 extending up out of the screwbase 50. The glass envelope 54 is then added to finish the lamp LED lamp assembly.

Thus, the LED lamp assembly of the present application is a suitable replacement for class A incandescent light bulbs. The screwbase 50 is sized to be compatible with standard sockets which are commonly used in various residential and/or commercial lighting applications. In addition, the lamp assembly includes an integrated ballast circuit that provides a power supply and a thermal management system such that the LED can be driven to provide the desired brightness while also providing good efficiency and a long lifetime for the LED and the ballast components. The thermal management system takes advantage of the metallic Edison style screwbase 50 as a heat sink to aid in cooling of the assembly.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A light emitting diode lamp assembly comprising:
a base;
a ballast circuit mounted on a circuit board and operable to provide a desired output current; and
a light emitting diode electrically connected to the ballast and driven by the output current of the ballast circuit to provide light;
wherein the base is filled with a thermally conductive substance and the circuit board is mounted in the base and in thermal contact with the thermally conductive substance such that heat is drawn away from the light emitting diode through the circuit board and into the thermally conductive substance to the base.

2. The light emitting diode lamp assembly of claim 1, wherein the light emitting diode is mounted on a top surface of the circuit board, and
wherein the circuit board further comprises a plurality of through hole vias formed in a center portion of the circuit board, wherein the through hole vias are thermally connected to the light emitting diode to draw heat produced by the light emitting diode away from the light emitting diode and toward the bottom surface of the circuit board which is in thermal contact with the thermally conductive substance.

3. The light emitting diode lamp assembly of claim 1, wherein the base is an Edison base and includes a plurality of threads formed on an outer surface thereof which aid in dissipating heat that is drawn away from the light emitting diode and circuit board through the thermally conductive substance out of the assembly.

4. The light emitting diode lamp assembly of claim 1, wherein the thermally conductive substance is a thermally conductive epoxy.

5. The light emitting diode lamp assembly of claim 4, wherein the ballast circuit further comprises:
an AC terminal operably to receive an AC voltage;
a rectifier circuit operable to convert the AC voltage into a DC voltage; and
a switching converter operable to control the DC voltage to provide the desired output current, wherein the AC terminal, rectifier circuit and switching converter are mounted on a bottom surface of the circuit board.

6. The light emitting diode lamp assembly of claim 5, wherein the ballast circuit further comprises:
an electromagnetic interference filter positioned between the AC terminal and the switching converter and operable to shield an AC power source from electromagnetic interference from the switching converter.

7. The light emitting diode lamp assembly of claim 6, wherein the ballast circuit further comprises a DC bus capacitor operable to smooth the DC voltage provided from the rectifier circuit.

8. The light emitting diode lamp assembly of claim 7, further comprising a control circuit operable to monitor the output current of the switching converter and to control the switching converter to provide the desired output current.

9. The light emitting diode lamp assembly of claim 8, wherein the electromagnetic interference filter, DC capacitor and control circuit are mounted on a bottom surface of the circuit board.

10. The light emitting diode lamp assembly of claim 9, wherein the light emitting diode is connected to the circuit board using surface mounting techniques.

11. The light emitting diode lamp assembly of claim 1, further comprising a mounting post extending upward from a center section of the circuit board, wherein the light emitting diode is mounted on the mounting post.

12. The light emitting diode lamp assembly of claim 11, wherein the mounting post is made of a thermally conductive material and is thermally connected to the light emitting diode at a first end and to the circuit board at a second end opposite the first end to conduct heat away from the light emitting diode.

13. The light emitting diode lamp assembly of claim 1, further comprising a rectangular circuit board extending upward from a center section of the circuit board, wherein the light emitting diode is mounted on a top end of the rectangular circuit board.

14. The light emitting diode lamp assembly of claim 13, wherein the rectangular circuit board further comprises:
a first thermally conductive layer on a first side of the rectangular printed circuit board;
a second thermally conductive layer on a second side of the rectangular circuit board; and
a second plurality of through hole vias formed between the first and second thermally conductive layers of the rectangular circuit board to aid in conducting heat away from the light emitting diode.

15. The light emitting diode lamp assembly of claim 14, wherein the rectangular circuit board is thermally connected to the circuit board such that heat from the light emitting diode is conducted away from the light emitting diode to the printed circuit board and on to the base via the thermally conductive substance.

16. The light emitting diode lamp assembly of claim 1, further comprising a glass envelope connected to the base to cover the light emitting diode.

17. A method of making an LED lamp assembly including a base, a ballast circuit mounted on a bottom surface of a printed circuit board and a light emitting diode mounted on a top surface of the printed circuit board, the method comprising:

attaching the light emitting diode to the top surface of the printed surface board using surface mount techniques;

inverting the printed circuit board;

connecting components of the ballast circuit on a bottom surface of the printed circuit board using through-hole techniques;

passing the top surface of the printed circuit board through a solder bath such that the all components mounted on the printed circuit board are soldered thereto in a single step while the printed circuit board is inverted;

returning the printed circuit board to an upright position;

connecting the ballast circuit to a positive and neutral terminal on the base;

filling the base with a thermally conductive substance;

mounting the printed circuit board in the base with the thermally conductive substance; and attaching a glass envelope to the base to enclose the light emitting diode.

18. A method of making an LED lamp assembly including a base, a ballast circuit mounted on a bottom surface of a first printed circuit board and a light emitting diode mounted on a rectangular second printed circuit board thermally connected to the top surface of the first printed circuit board, the method comprising:

attaching control components to the top surface of the first printed surface board using surface mounting techniques;

inverting the printed circuit board;

connecting components of the ballast circuit on a bottom surface of the printed circuit board using through hole terminals;

mounting the second printed circuit board in a slot formed on the first printed circuit board;

mounting the light emitting diode on the second printed circuit board;

passing the top surface of the printed circuit board through a solder bath such that the all components mounted on the printed circuit board are soldered thereto in a single step while the printed circuit board is inverted;

connecting the ballast circuit to a positive and neutral terminal on the base;

filling the base with a thermally conductive substance;

mounting the printed circuit board in the base with the thermally conductive substance in the inverted position such that the second printed circuit board extends upward away from the base; and attaching a glass envelope to the base to enclose the light emitting diode.

* * * * *